United States Patent [19]

Mihara

[11] Patent Number: 4,692,874
[45] Date of Patent: Sep. 8, 1987

[54] ELECTRONIC WATT-HOUR METER

[75] Inventor: Yuji Mihara, Yokohama, Japan

[73] Assignee: Kabushiki Kaisha Toshiba, Kanagawa, Japan

[21] Appl. No.: 668,866

[22] Filed: Nov. 6, 1984

[30] Foreign Application Priority Data

Nov. 11, 1983 [JP] Japan ............................ 58-212049

[51] Int. Cl.$^4$ ...................... G01R 21/00; G06F 15/56
[52] U.S. Cl. .............................. 364/483; 324/103 R; 324/116
[58] Field of Search ............... 364/482, 483, 492, 464, 364/466; 324/103 R, 116

[56] References Cited

U.S. PATENT DOCUMENTS

| 4,022,977 | 5/1977 | Nomura | 364/482 X |
| 4,082,999 | 4/1978 | Staker | 324/116 |
| 4,261,037 | 4/1981 | Hicks | 324/103 R X |
| 4,291,375 | 9/1981 | Wolf | 364/483 |
| 4,291,376 | 9/1981 | McCahill | 364/483 |
| 4,355,361 | 10/1982 | Riggs et al. | 324/103 R X |
| 4,516,213 | 5/1985 | Gidden | 364/483 |

FOREIGN PATENT DOCUMENTS 57-144467 9/1982 Japan .

OTHER PUBLICATIONS

The New TM-80 Register—General Electric Company Brochure.

Primary Examiner—Errol A. Krass
Assistant Examiner—H. R. Herndon
Attorney, Agent, or Firm—Schwartz, Jeffery, Schwaab, Mack, Blumenthal & Evans

[57] ABSTRACT

In an electronic watt-hour meter including a power measuring device and a clock circuit, a data setting device for setting data such as time zones, holidays and the like and programs is detachably connected to a data transmission circuit, while a PROM for storing the set data and programs and a ROM for storing programs required for receiving the set data and programs through the data transmission circuit and storing the same in the PROM are provided in a memory circuit. Under the control of a CPU, an electric power measured by the power measuring device is processed in accordance with the data and the programs stored in the PROM and displayed on a displaying device, while the data setting device itself is removed from the watt-hour meter after the data and the programs have been memorized in the PROM.

1 Claim, 3 Drawing Figures

ELECTRONIC WATT-HOUR METER

BACKGROUND OF THE INVENTION

This invention relates to an electronic watt-hour meter which particularly includes a clock circuit and is capable of transferring the display of the measured amount of electric power in accordance with preset time zones and the like and also in accordance with programs.

An ordinary electronic watt-hour meter of the above described type comprises an electric power measuring device for measuring consumed electric power, a clock circuit for generating a clock signal, a data setting device for setting data such as time zones in a day, holidays and the like, to which different charge rates are applied, a memory circuit for memorizing the data set by the data setting device, a central processing unit (CPU) which is operable to write and read the set data into and out of the memory circuit and to designate, in accordance with the set data, a position where the measured value is to be displayed, and a display device for displaying the measured value at the designated position.

In the above described watt-hour meter, the measured value (in watts) is delivered to CPU in the form of a pulse signal, while the clock circuit constantly supplies a clock signal representing the present instant to CPU. The CPU writes and reads the data set by the setting device into and out of the memory circuit, and the display device has a plurality of displaying positions for displaying the measured amounts of electric power as well as the maximum power demand.

With the above described construction of the conventional watt-hour meter, the data such as the time zones, holidays and the like must be set for every individual watt-hour meter, and therefore a data setting device in the form of a keyboard switch has been ordinarily provided in combination with the watt-hour meter. However, since it is essential to prevent unauthorized alteration of the set values from outside, the keyboard switch must be sealed after the completion of the setting operation, thus requiring a considerable amount of time for setting data, although the keyboard switch has an advantageous feature of a general-use construction. Furthermore, the keyboard switch requires a comparatively large space, rendering impossible to reduce the size of the watt-hour meter. In addition, since a watt-hour meter of two, three or four time zones requires a corresponding number of display positions, it is impossible to convert a watt-hour meter of, for instance, four time zones, to that of five time zones.

In the above described conventional watt-hour meter, the power measuring device is provided with an electric power conversion circuit for converting the measured value (in watts) into a pulse signal corresponding to the measured value, and a frequency-divider for dividing the frequency of the pulse signal at desired rates. The output of the frequency-divider is delivered to the CPU.

For eliminating the above described difficulties, there has been proposed a modification wherein the operation of frequency-divider is programmed such that the pulse rate of the output signal is varied in accordance with the time zones and the like. However, nothing has been proposed about the improvement of the data setting device for eliminating the above described difficulties.

SUMMARY OF THE INVENTION

An object of the invention is to provide an electronic watt-hour meter wherein a data setting device is provided detachably for setting data such as time zones and the like and also programs for processing the set data, and after setting the required data, the data setting device is removed from the power meter for minimizing the size thereof.

Another object of the invention is to provide an electronic watt-hour meter wherein a data transmission circuit is further provided for transmitting the data and programs set by the data setting device therethrough to be memorized in a PROM so that various operations can be performed by the same watt-hour meter by changing the data and programs as desired, and wherein the measured electric power is transferred suitably in accordance with the contents of the PROM so as to be displayed on the display device.

These and other objects of the present invention can be achieved by an electronic watt-hour meter comprising a power measuring device, a clock circuit for generating a clock signal, a data setting device for setting data and programs, a data transmission circuit to which the data setting device is connected detachably, a memory circuit which receives the data and the programs set by the data setting device through the data transmission circuit and stores the set data and programs, the memory circuit including a PROM (Programmable Read Only Memory Device) for storing the set data and programs and a ROM (Read Only Memory Device) which preliminarily stores programs required for receiving and memorizing the set data and programs in said PROM through the data transmission circuit, a CPU (Central Processing Unit) which controls the power measuring device in accordance with the set data and programs stored in the PROM, and receives the measured results therefrom, and a display device which displays the measured results under the control of the CPU.

According to this invention, the data setting device detachably connected to the transmission circuit is constructed to set not only the time zones, holidays and the like, but also programs for displaying the measured results with respect to different time zones and also in the form of effective, reactive and apparent electric powers, so that various operations can be carried out by the same watt-hour meter by changing the programs optionally being given by the data setting device as desired. For instance, the way of displaying the measured results may be varied as desired depending on the set programs, so that a watt-hour meter operable in variable number of time zones can be thereby obtained. Furthermore, since the data setting device is constructed to be removable after the completion of the setting operation, the size of the main portion of the watt-hour meter can be substantially reduced, and unauthorized alteration of the setting can be prevented.

BRIEF DESCRIPTION OF THE DRAWINGS

In the accompanying drawings

DESCRIPTION OF THE PREFERRED EMBODIMENT

Figure 1:
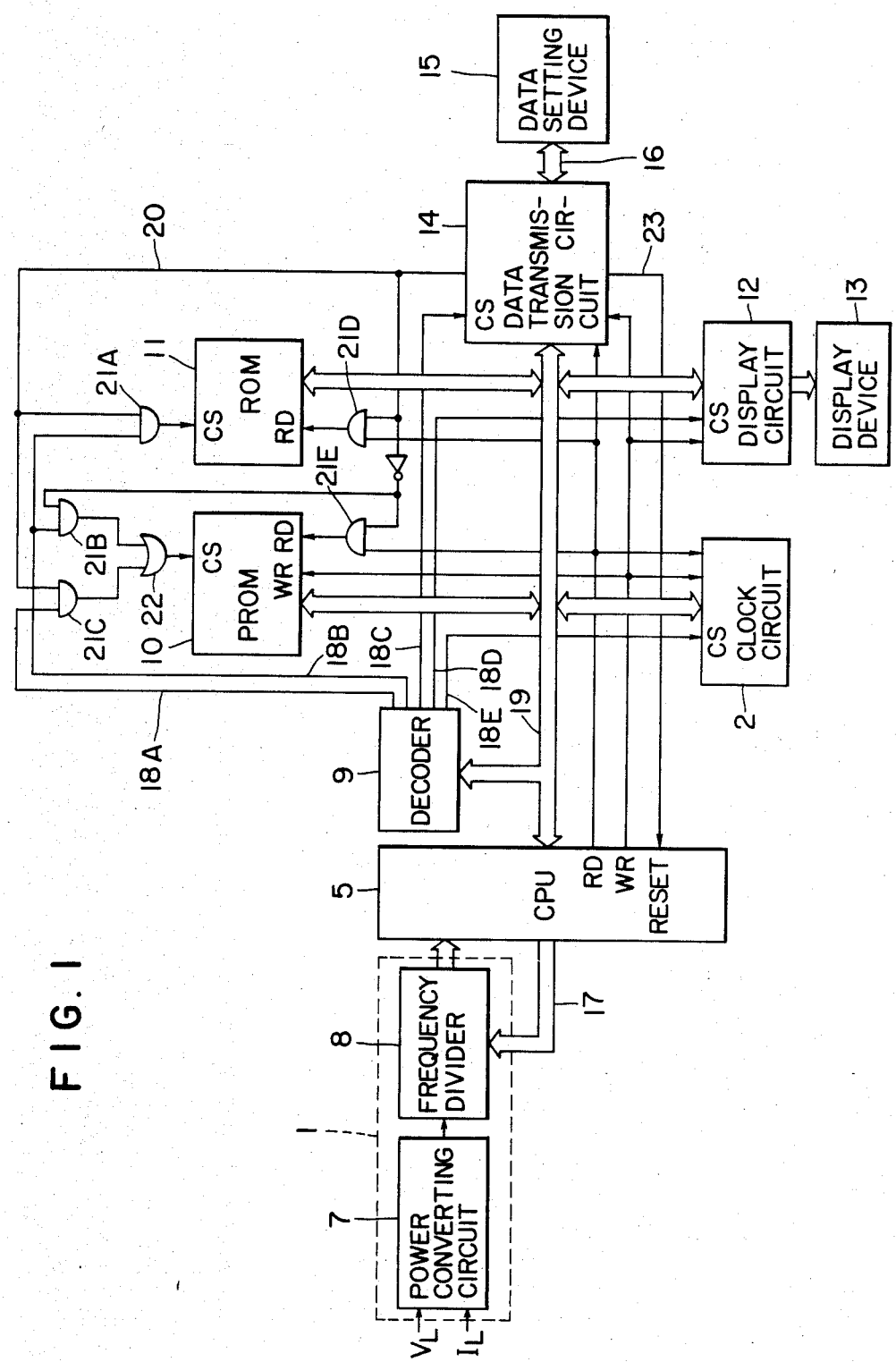
FIG. 1 is a block diagram showing a preferred embodiment of the present invention.

Referring now to FIG. 1, there is illustrated an electronic watt-hour meter according to the present invention. An electric power measuring device 1 provided in the watt-hour meter comprises an electric power converting circuit 7 which receives a load voltage $V_L$ and a load current $I_L$ and delivers an output pulse signal corresponding to the electric power (in watts), and a frequency divider 8 which divides the frequency of the output pulse signal. The output of the frequency divider 8 is supplied to a CPU (Central Processing Unit) 5, which in turn, delivers a frequency dividing ratio setting signal 17 to the frequency divider 8 for providing a pulse signal corresponding to the electric power.

Figure 2:
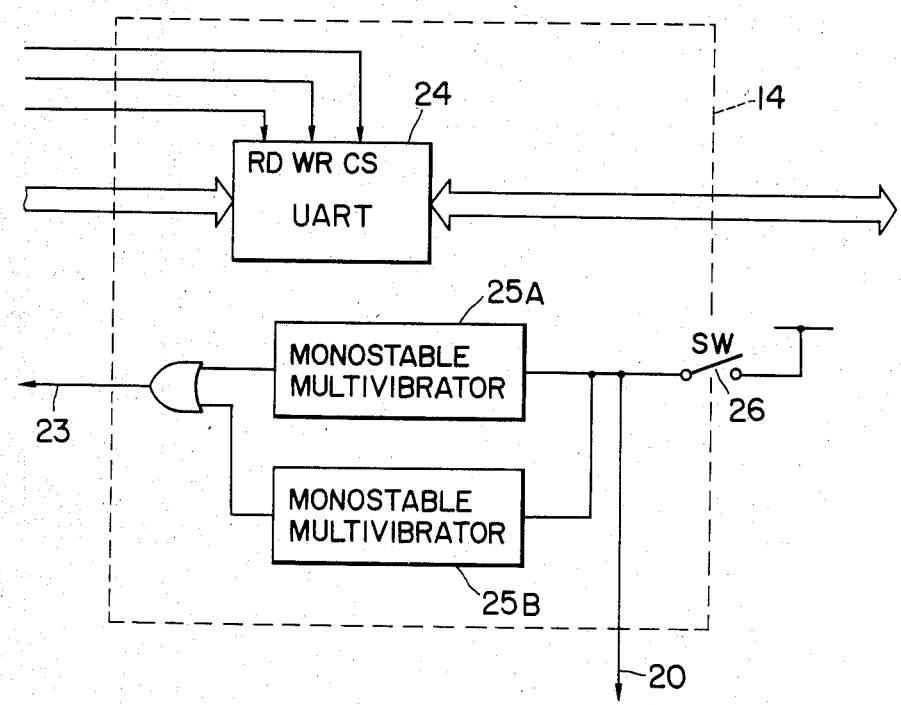
FIG. 2 is a block diagram showing an example of a data transmission circuit used in the embodiment shown in FIG. 1.

Upon reception of an address signal from CPU 5, a decoder 9 delivers select signals 18A through 18E for selecting the operations of a clock circuit 2, a PROM (Programmable Read Only Memory Device) 10, a ROM 11, a display circuit 12 and a data transmission circuit 14. Among these circuit elements, the clock circuit 2 constantly supplies a clock signal indicative of the present instant to CPU 5 for controlling time zone transferring instants. On the other hand, the PROM 10 and ROM 11, forming in combination a memory circuit, store programs for controlling CPU 5. A data and program setting device 15 is detachably connected to the data transmission circuit through a bus line 16. The PROM 10 and ROM 11 are connected to the CPU 5 through address data bus line 19. The programs stored in the PROM 10 can be rewritten by the program setting device 15 through the data transmission circuit 14 after initially constructed and the programs stored in the ROM 11 cannot be rewritten thereafter, and the PROM 10 and ROM 11 are operated by the read (RD) and write (WR) signals from the CPU 5, respectively. A display device 13 displays the output of the display circuit 12 in terms of digital quantities. The data transmission circuit 14 is also connected to the CPU 5 through the address data bus line 19. The data transmission circuit 14 may be made of, for instance, UART (Universal Asynchronous Receiver Transmitter) 24 as illustrated in FIG. 2, and transmits and receives information to and from the data setting device 15 in a serial manner. In FIG. 2, a switch 26 is provided to be operable in response to the connection and disconnection of the data setting device 15 to and from the data transmission circuit 14. The data transmission circuit 14 includes two monostable multivibrators 25A and 25B. The multivibrator 25A detects a build-up instant of a signal from the switch 26, while the multivibrator 25B detects build-down instant of the same signal, and upon detection of such instants, either of the multivibrators 25A and 25B delivers a pulse signal of a predetermined width. Either of the pulse signals is applied to a reset terminal (RESET) of the CPU 5 as a reset signal for resetting the same. When the data setting device 15 is connected to the data transmission circuit 14, that is, when the data transmission circuit is in the data or program transmitting condition, the circuit 14 further delivers a transmission status signal 20 to AND gates 21A through 21E for controlling the same (see FIG. 1). Furthermore, the select signal 18A delivered from the decoder 9 is applied through the AND gate 21C and an OR gate 22 to a chip select terminal (CS) of the PROM 10. Likewise, the select signal 18B from the decoder 9 is applied through the AND gate 21B and the OR gate 22 to the aforementioned chip select terminal (CS) of the PROM 10. A read signal and a write signal (RD) and (WR) from the CPU 5 are both applied to the PROM 10. That is, the read signal (RD) is applied to the PROM 10 through an AND gate 21E. On the other hand, only the read signal (RD) from the CPU 5 is applied to the ROM 11 through an AND gate 21D. The ROM 11 stores programs for controlling the transmission circuit 14 and also for controlling the writing operation of the data and the programs into the PROM 10.

The electronic watt-hour meter of the above described construction operates as follows.

In a case where the data setting device 15 is not connected to the data transmission circuit 14 through the data bus line 16, the transmission status signal 20 is brought to "0", whereas when the setting device 15 is connected, the status signal 20 is brought to "1". By applying the status signal 20 at "1" level, an access to the ROM 11 of the CPU 5 by way of the select signal 18B and the read signal (RD) is made possible. Furthermore, when the status signal 20 is at "1" level, one of the inputs to the AND gate 21C is made "1", and hence a writing operation into the PROM 10 by use of the select signal 18A and a write signal is made possible.

Figure 3:
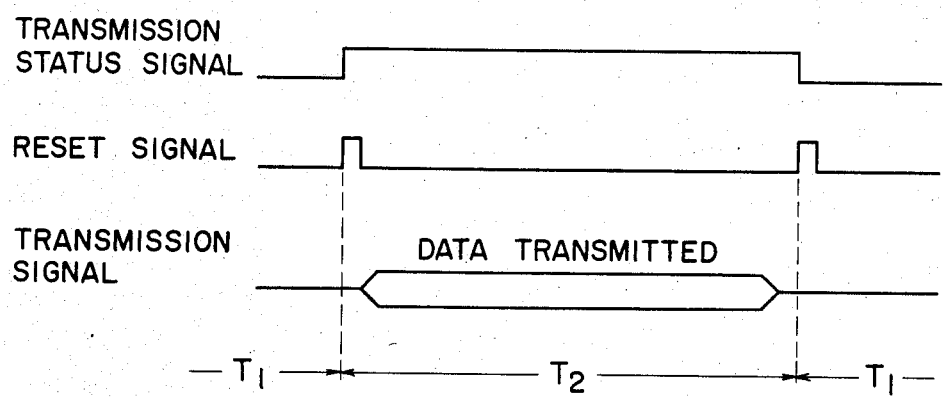
FIG. 3 is a timing chart for explaining the operation of the data transmission circuit shown in FIG. 2.

FIG. 3 is a timing chart indicating the above described operations. At the same time when the transmission status signal 20 becomes "1", the monostable multivibrator 25A operates to deliver a pulse signal, a reset signal 23 thereby resetting the CPU 5. As a consequence, the CPU 5 executes programs starting from the 0 address for delivering a select signal 18B. The select signal 18B is applied to the ROM 11 through the AND gate 21A, thereby to operate CPU 5 in accordance with the instructions stored in the ROM 11. That is, in a period $T_2$ shown in FIG. 3, CPU 5 receives data and programs set by the data setting device 15 through the UART 24, and writes the data and programs into the PROM 10. At this time, the PROM 10 is controlled by the select signal 18A and the write signal.

Upon termination of the writing operation in the PROM 10, the data setting device 15 is disconnected from the data transmission circuit 14 so that the transmission status signal 20 is brought to "0" level. At this time, since one of the inputs of the AND gates 21B and 21E is brought to "1", the read signal RD and the select signal 18B are applied to the PROM 10. In this case, since one of the inputs of the AND gate 21C is held at "0", the select signal 18A is not applied to the PROM 10. Furthermore, the application of the read signal and the select signal to the ROM 11 is prohibited by the AND gates 21D and 21A, so that the access of the CPU 5 to the ROM 11 is prohibited at this time. In addition, at the same time with the build-down of the transmission status signal 20, another monostable multivibrator 25B operates to deliver the reset signal for resetting CPU 5 (during an interval $T_1$ in FIG. 3), and therefore the CPU 5 executes the programs starting from 0 address of the PROM 10.

Summarizing the above description, during the time period $T_1$ in the timing chart, CPU 5 operates in accordance with the contents of PROM 10, while in the interval $T_2$, CPU 5 operates in accordance with the contents of ROM 11. The frequency dividing ratio of the frequency divider 8 provided in the power measuring device 1 is set to a predetermined frequency dividing ratio when the CPU 5 operates according to the contents of the PROM 10, and hence the output of the power converting circuit 7 is converted into the corresponding value, and is received in the CPU 5. The displaying device 13 which displays the value obtained in the display circuit 12 may be a dot-matrix type liquid crystal display device (LCD), a plasma display device, cathode ray tube (CRT) and the like, the displayed values being controlled by the CPU 5 through the display circuit 12 in accordance with the programs set by the data setting device 15 and now stored in the PROM 10 so that the measured electric power is displayed on the display device with respect to different time zones and also in the form of an effective electric power, reactive electric power and an apparent electric power (in volt-ampere-hour), for example.

In the above described embodiment, although a ROM 11 and a PROM 10 have been provided in the memory circuit as its essential components, in a case where the CPU 5 includes a mask ROM, only a PROM may be provided in the memory circuit. In such an arrangement, it is apparent that the advantageous effect similar to those obtained by the above described embodiment can also be obtained by the modified arrangement when the transmission status signal used in the embodiment is utilized as a transfer signal between the mask ROM and the PROM.

What is claimed is:
1. An electronic watt-hour meter comprising:
   an electric power measuring device;
   a data setting device for setting data including time zone data and holiday data, and for setting programs for displaying measurement results with respect to different time zones in the form of effective, reactive, or apparent electric power as desired by using said data setting device;
   a data transmission circuit to which the data setting device is connected detachably;
   a programmable read only memory circuit (PROM) which receives the data and programs set by the data setting device through the data transmission circuit and stores the set data and programs;
   a read only memory (ROM) which preliminarily stores transmission programs for controlling said data transmission circuit;
   a central processing unit (CPU) which controls the power measuring device so as to receive measurement results therefrom in accordance with the set data and programs stored in said PROM, and which also controls receiving and storing data and programs in said PROM in accordance with said transmission programs in said ROM;
   a display device which displays the measured results under the control of said CPU; and
   a switch means for making said CPU operate in accordance with the data and programs in said PROM when said data setting device is detached from said data transmission circuit, and for making said CPU operate in accordance with the transmission programs in said ROM when said data setting device is attached to said data transmission circuit.

* * * * *